US009708711B2

(12) United States Patent
Hirose et al.

(10) Patent No.: US 9,708,711 B2
(45) Date of Patent: Jul. 18, 2017

(54) PROCESSING APPARATUS AND PROCESS STATUS CHECKING METHOD

(71) Applicant: TOKYO ELECTRON LIMITED, Tokyo (JP)

(72) Inventors: Katsuhito Hirose, Yamanashi (JP); Toshio Miyazawa, Yamanashi (JP); Toshiharu Hirata, Yamanashi (JP); Toshimasa Tanaka, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 638 days.

(21) Appl. No.: 13/748,988

(22) Filed: Jan. 24, 2013

(65) Prior Publication Data

US 2013/0186332 A1    Jul. 25, 2013

(30) Foreign Application Priority Data

Jan. 25, 2012    (JP) ................................. 2012-013249

(51) Int. Cl.
*C23C 16/52*    (2006.01)
*C23C 16/455*    (2006.01)

(52) U.S. Cl.
CPC ........ *C23C 16/52* (2013.01); *C23C 16/45544* (2013.01); *C23C 16/45561* (2013.01)

(58) Field of Classification Search
CPC .............. C23C 16/52; C23C 16/45544; C23C 16/45561
See application file for complete search history.

(56) References Cited

U.S. PATENT DOCUMENTS 5,470,390 A * 11/1995 Nishikawa .............. B01F 3/026
                                                    118/715
5,693,189 A * 12/1997 Oguro ...................... B01J 4/008
                                                    203/3

(Continued)

FOREIGN PATENT DOCUMENTS

CN        1574200 A    2/2005
CN      101416284 A    4/2009

(Continued)

OTHER PUBLICATIONS

Office Action issued Jan. 24, 2014 in Korean Patent Application No. 10-2013-0008331.

*Primary Examiner* — Jeffrie R Lund
(74) *Attorney, Agent, or Firm* — Oblon, McClelland, Maier & Neustadt, L.L.P.

(57) ABSTRACT

A processing apparatus includes a processing chamber, gas supply paths provided in a corresponding relationship with the kinds of process gases supplied into the processing chamber, and valves respectively arranged in the gas supply paths. The apparatus further includes a measuring unit for measuring a physical parameter associated with each of the process gases passing through the gas supply paths, a register unit which stores the physical parameter, and a control unit configured to determine a process status based on the physical parameter stored in the register unit. The register unit is provided in a lower-hierarchy control device connected to the control unit of a higher hierarchy to transmit and receive signals to and from the control unit. The lower-hierarchy control device is configured to control input and output signals between the control unit and end devices under the control of the control unit.

4 Claims, 8 Drawing Sheets

(56) References Cited

U.S. PATENT DOCUMENTS

| | | | | |
|---|---|---|---|---|
| 6,039,809 A * | 3/2000 | Toyama | B01F 3/026 | 118/715 |
| 6,123,767 A * | 9/2000 | Toyama | B01F 3/026 | 117/81 |
| 6,129,044 A * | 10/2000 | Zhao | C23C 16/4411 | 118/715 |
| 8,202,367 B2 * | 6/2012 | Tachibana | C23C 16/4485 | 118/633 |
| 8,931,506 B2 * | 1/2015 | Nagata | B01B 1/005 | 118/726 |
| 9,109,288 B2 * | 8/2015 | Yoshimoto | C23C 16/45561 | |
| 2001/0042523 A1 * | 11/2001 | Kesala | C23C 16/4481 | 122/6.6 |
| 2001/0054377 A1 * | 12/2001 | Lindfors | C23C 16/4402 | 117/104 |
| 2002/0127745 A1 | 9/2002 | Lu et al. | | |
| 2003/0143747 A1 * | 7/2003 | Bondestam | C23C 16/4402 | 436/34 |
| 2004/0250600 A1 | 12/2004 | Bevers et al. | | |
| 2009/0266296 A1 * | 10/2009 | Tachibana | C23C 16/45544 | 118/663 |
| 2011/0065289 A1 * | 3/2011 | Asai | C23C 16/345 | 438/791 |
| 2012/0160358 A1 * | 6/2012 | Yoshimoto | C23C 16/45561 | 137/861 |
| 2012/0269969 A1 * | 10/2012 | Suzuki | C23C 16/345 | 427/255.28 |
| 2013/0183443 A1 * | 7/2013 | Hirose | H03K 21/023 | 427/248.1 |
| 2013/0186332 A1 * | 7/2013 | Hirose | C23C 16/52 | 118/712 |
| 2013/0323935 A1 * | 12/2013 | Suzuki | H01L 21/02271 | 438/778 |
| 2015/0275366 A1 * | 10/2015 | Fukushima | C23C 16/45544 | 438/778 |
| 2016/0047039 A1 * | 2/2016 | Hirose | C23C 16/45544 | 118/697 |

FOREIGN PATENT DOCUMENTS

| | | |
|---|---|---|
| JP | 2002-329674 | 11/2002 |
| JP | 2003-286575 | 10/2003 |
| KR | 10-2004-0096700 A | 11/2004 |
| KR | 10-2010-0109931 A | 10/2010 |
| KR | 10-2011-0038607 A | 4/2011 |

* cited by examiner

PROCESSING APPARATUS AND PROCESS STATUS CHECKING METHOD

CROSS-REFERENCE TO RELATED APPLICATIONS

This application claims priority to Japanese Patent Application No. 2012-013249 filed on Jan. 25, 2012, the entire contents of which are incorporated herein by reference.

FIELD OF THE INVENTION

The present invention relates to a processing apparatus for performing a film forming process or the like by supplying a processing gas on a target object to be processed, e.g., a semiconductor wafer, and a process status checking method for checking a process status in the processing apparatus to detect or prevent an abnormality.

BACKGROUND OF THE INVENTION

In a manufacturing process of a semiconductor device, a target object to be processed such as a semiconductor wafer or the like is repeatedly subjected to various kinds of processing such as a film forming, an etching, a heat treatment and a modification treatment. For example, there is known a CVD (Chemical Vapor Deposition) method to form a thin film on a surface of a semiconductor wafer. In the CVD method, a semiconductor wafer is arranged within a processing chamber of a processing apparatus. A processing gas containing a source gas is introduced into the processing chamber to generate a reaction product. A thin film made of the reaction product is deposited on the surface of the semiconductor wafer.

In recent years, there is also known an ALD (Atomic Layer Deposition) method as a film forming method. In the ALD method, a source gas and a reaction gas are alternately supplied into a processing chamber to form thin films one layer after another each of which has a thickness of atomic level or molecular level. The ALD method can provide a film having a good quality and can accurately control the film thickness. For that reason, the ALD method draws attention as a manufacturing method of a semiconductor device which is becoming more scaled down.

In case where a thin film of, e.g., TiN, is formed by the ALD method, the thin film is deposited by repeatedly performing a series of the following steps i) through iv), for example.

i) A source gas, e.g., a $TiCl_4$ gas, is supplied into a processing chamber, thereby causing $TiCl_4$ to adhere onto a wafer surface.

ii) The inside of the processing chamber is purged by a $N_2$ gas to remove the remaining source gas from the processing chamber.

iii) A reaction gas, e.g., an $NH_3$ gas, is supplied into the processing chamber to react with the $TiCl_4$ adhered onto the wafer surface to thereby form a thin layer of TiN film.

iv) The inside of the processing chamber is purged by a $N_2$ gas to remove the remaining gas from the processing chamber.

In the ALD method, as described in the TiN film formation example above, supplies and cutoffs of different kinds of gases including the source gas need to be intermittently and repeatedly performed within a short period of time. In an ALD apparatus, the supply and cutoff of the gas is performed with an electromagnetic valve, which is provided in a gas supply path through which the gas is supplied to the processing chamber, and is opened and closed by a signal transmitted from a control unit based on a gas supply recipe.

In case of the film forming process performed by the ALD method, as compared with the film forming process performed by the CVD method, the time required in opening and closing the valve once becomes shorter and the opening/closing frequency of the valve becomes extremely high. Since the opening and closing speed of the valve is very fast in the ALD apparatus, there is a problem in that a conventional control system has a difficulty in monitoring the process status such as a flow rate of a gas introduced into a processing chamber and a pressure increase within the processing chamber caused by the gas introduction.

In respect of the film forming process performed by the ALD method, Japanese Patent Application Publication No. 2002-329674 (e.g., FIG. 1) (corresponding to U.S. Patent Application Publication No. 2002/0127745A1) discloses a valve control system including a programmable logic controller configured in communications with a system control computer and operatively connected to an electrically-controlled valve. In this valve control system, the valve control refresh time is reduced to 10 milliseconds or less.

Japanese Patent Application Publication No. 2003-286575 (e.g., the claims) (corresponding to U.S. Patent Application Publication No. 2003/0143747A1) describes a method in which a sensor detects characteristic parameters such as a pressure in a gas flow path and a valve vibration, and provides a signal indicative of the characteristic parameters as a function of time in order to measure changes in gas pulses supplied into a processing chamber in an ALD apparatus. A curve shape is generated from the sensor signal, and the changes in the curve shape are monitored.

While JP2002-329674A discloses the ALD apparatus capable of coping with the high-speed opening and closing of the valve, no consideration is given to how to rapidly observe the process status such as a flow rate of a gas introduced into a processing chamber and a pressure increase in the processing chamber caused by the gas introduction. In JP2003-286575A, the process status is monitored based on the change in the characteristic parameters. Since the curve shape obtained by providing the sensor signal indicative of the characteristic parameters is monitored in JP2003-286575A, it may not possible to detect a trouble accurately and, further, it may possibly be time-consuming to detect the trouble.

SUMMARY OF THE INVENTION

In view of the above, the present invention provides a processing apparatus and a process status checking method capable of rapidly detecting or preventing in advance an occurrence of abnormality in a process.

In accordance with a first aspect of the present invention, there is provided a processing apparatus including: a processing chamber configured to accommodate a target object to be processed; gas supply paths provided in a corresponding relationship with the kinds of process gases supplied into the processing chamber; valves respectively arranged in the gas supply paths to open and close the gas supply paths; a measuring unit configured to measure a physical parameter associated with each of the process gases passing through the gas supply paths; a register unit configured to store the physical parameter measured by the measuring unit; and a control unit configured to determine a process status based on the physical parameter stored in the register unit.

The register unit is provided in a lower-hierarchy control device connected to the control unit of a higher hierarchy to transmit and receive signals to and from the control unit, and the lower-hierarchy control device is configured to control input and output signals between the control unit and end devices under the control of the control unit.

In accordance with a second aspect of the present invention, there is provided a process status checking method for use with a processing apparatus, which includes a processing chamber configured to accommodate a target object to be processed; gas supply paths provided in a corresponding relationship with the kinds of process gases supplied into the processing chamber; valves respectively arranged in the gas supply paths to open and close the gas supply paths; a measuring unit configured to measure a physical parameter associated with each of the process gases passing through the gas supply paths; a register unit configured to store the physical parameter measured by the measuring unit; and a control unit configured to determine a process status based on the physical parameter stored in the register unit.

The method includes: storing the physical parameter in the register unit; and acquiring the physical parameter from the register unit and determining the process status. The register unit is provided in a lower-hierarchy control device connected to the control unit of a higher hierarchy to transmit and receive signals to and from the control unit. The lower-hierarchy control device is configured to control input and output signals between the control unit and end devices under the control of the control unit.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

Hereinafter, embodiments of the present invention will now be described in detail with reference to the accompanying drawings which form a part hereof.

First Embodiment

Configuration Example of Film Forming Apparatus

Figure 1:
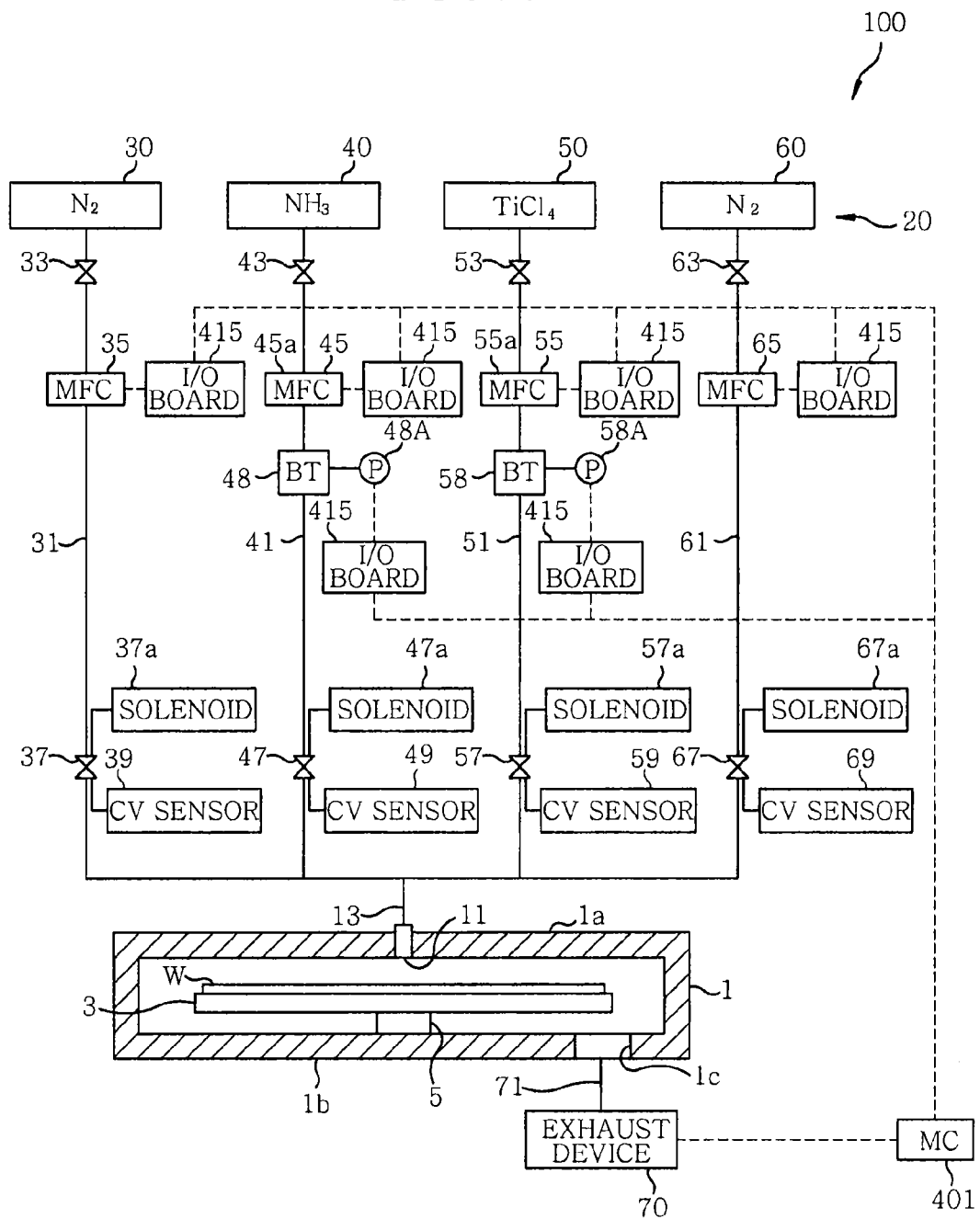
FIG. 1 is an explanatory view showing a schematic configuration of a film forming apparatus in accordance with a first embodiment of the present invention.

First, a processing apparatus in accordance with a first embodiment of the present invention will be described with reference to FIG. 1. FIG. 1 shows a schematic configuration of a film forming apparatus 100 of the first embodiment configured to perform a film forming process on a substrate, e.g., a semiconductor wafer (hereinafter just referred to as "wafer") W by an ALD method. The film forming apparatus 100 includes a hermetically sealed processing chamber 1 of a substantially cylindrical shape. In the processing chamber 1, there is provided a susceptor 3 for horizontally supporting the wafer W as a target object to be processed. The susceptor 3 is supported by a cylindrical support member 5. A heater (not shown) is embedded in the susceptor 3. The wafer W is heated to a predetermined temperature by feeding electric power to the heater.

A gas introduction unit 11 is provided at a ceiling wall 1a of the processing chamber 1. A gas injection hole (not shown) is formed in the gas introduction unit 11. A pipe 13 as a gas supply path is connected to the gas introduction unit 11. Pipes 31, 41, 51 and 61 are joined to the pipe 13 and are connected to a gas supply source 20 for supplying source gases.

In the film forming apparatus 100 shown in FIG. 1, a TiN film is formed on a surface of the wafer W through an ALD method. In this case, the gas supply source 20 includes a $N_2$ gas supply source 30 as a purge gas supply source, an $NH_3$ gas supply source 40 as a reaction gas supply source and a $TiCl_4$ gas supply source 50 as a source gas supply source and a $N_2$ gas supply source 60 as another purge gas supply source.

The $N_2$ gas supply source 30 is connected to the gas introduction unit 11 through the pipes 31 and 13. A valve 33, a mass flow controller (MFC) 35 for controlling a gas flow rate and a chamber valve 37 are arranged in the pipe 31.

The $NH_3$ gas supply source 40 is connected to the gas introduction unit 11 through the pipes 41 and 13. A valve 43, a mass flow controller (MFC) 45 for controlling a gas flow rate and a chamber valve 47 are arranged in the pipe 41. In the pipe 41, a buffer tank (BT) 48 is arranged near the $NH_3$ gas supply source 40 at the upstream side of the chamber valve 47 along a gas supply direction. A pressure gauge (measuring unit) 48A for measuring the internal pressure of the buffer tank 48 is attached to the buffer tank 48.

The $TiCl_4$ gas supply source 50 is connected to the gas introduction unit 11 through the pipes 51 and 13. The $TiCl_4$ gas supply source 50 is provided with a vaporizer (not shown). A valve 53, a mass flow controller (MFC) 55 for controlling a gas flow rate and a chamber valve 57 are arranged in the pipe 51. In the pipe 51, a buffer tank (BT) 58 is arranged near the $TiCl_4$ gas supply source 50 at the upstream side of the chamber valve 57 along the gas supply direction. A pressure gauge (measuring unit) 58A for measuring the internal pressure of the buffer tank 58 is attached to the buffer tank 58.

The $N_2$ gas supply source 60 is connected to the gas introduction unit 11 through the pipes 61 and 13. A valve 63, a mass flow controller (MFC) 65 for controlling a gas flow rate and a chamber valve 67 are arranged in the pipe 61.

The chamber valves 37, 47, 57 and 67 are arranged closest to the processing chamber 1 in the respective pipes 31, 41, 51 and 61. When the chamber valves 37, 47, 57 and 67 are opened, the respective gases are introduced into the processing chamber 1. When the chamber valves 37, 47, 57 and 67 are closed, the supplies of the respective gases into the processing chamber 1 are stopped.

Each of the chamber valves 37, 47, 57 and 67 is an electromagnetic valve (solenoid valve) that can be opened and closed at a high speed. In FIG. 1, for the sake of convenience in description, solenoids 37a, 47a, 57a and 67a respectively serving as valve drive units are shown in a corresponding relationship with the chamber valves 37, 47, and 67. The solenoids 37a, 47a, 57a and 67a are components included in the respective chamber valves 37, 47, 57 and 67.

Sensor units serving as chamber valve sensors (CV sensors) 39, 49, 59 and 69 each of which includes, e.g., a position sensor, are arranged respectively in the chamber valves 37, 47, 57 and 67. The CV sensors 39, 49, 59 and 69 monitor the opening and closing states of the chamber valves 37, 47, 57 and 67 operated by the solenoids 37a, 47a, 57a and 67a, respectively.

While the reaction gas supply source, the source gas supply source and the purge gas supply source are provided in the film forming apparatus 100 shown in FIG. 1, the gas supply source 20 may further include other gas sources, e.g., a cleaning gas supply source for cleaning the inside of the processing chamber 1. In this case, a pipe and a valve are provided in a corresponding relationship with each of the other gas supply sources.

An exhaust port 1c is formed in a bottom wall 1b of the processing chamber 1. An exhaust device 70 is connected to the exhaust port 1c through an exhaust pipe 71. The inside of the processing chamber 1 can be depressurized to a predetermined vacuum level by operating the exhaust device 70.

Configuration Example of Control System

Next, a control system for the film forming apparatus 100 will be briefly described with reference to FIGS. 1 to 3. As will be described later, the film forming apparatus 100 is controlled by a module controller (MC) 401 to perform a predetermined process in the processing chamber 1.

Figure 2:
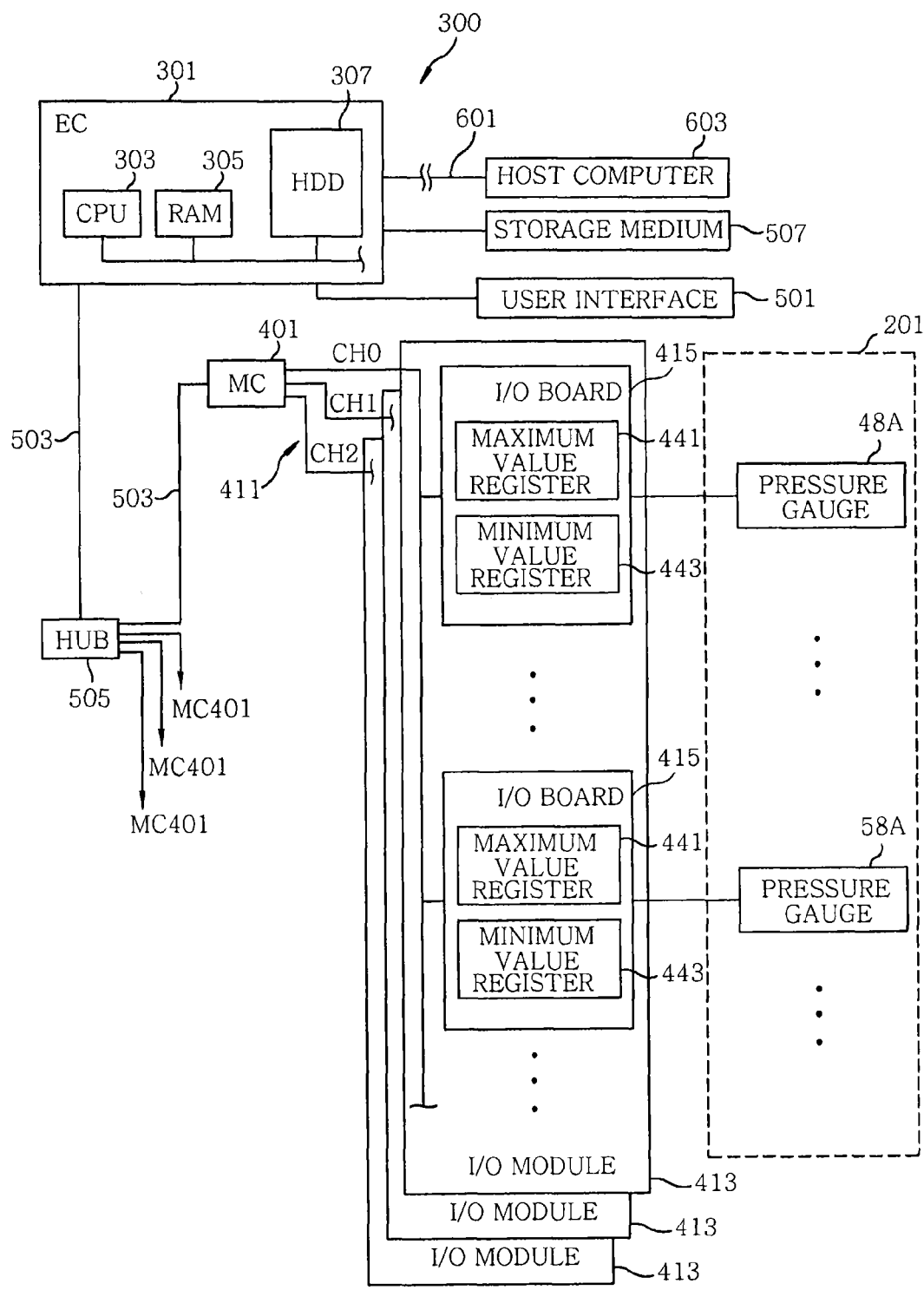
FIG. 2 is an explanatory view showing a schematic configuration of a control system for a substrate processing system including the film forming apparatus of the first embodiment.
Figure 3:
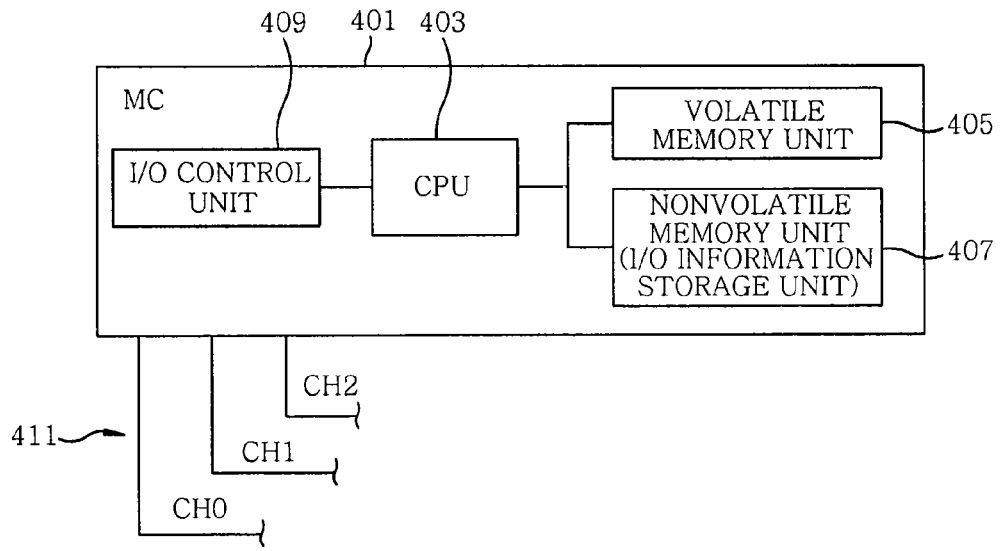
FIG. 3 is an explanatory view showing a schematic configuration of a module controller in accordance with the first embodiment of the present invention.

FIG. 2 schematically shows a part of the control system for a substrate processing system (not shown) including the film forming apparatus 100, which relates to the control of the film forming apparatus 100 for performing an ALD process. The entire control of the entirety of the substrate processing system and the control of the respective component parts, i.e., the end devices 201, included in the film forming apparatus 100 as a process ship, are performed by a control unit 300. Examples of the end devices 201 may include the chamber valves 37, 47, 57 and 67 (the solenoids 37a, 47a, 57a and 67a), the mass flow controllers 35, 45, 55 and 65, the pressure gauges 48A and 58A, the CV sensors 39, 49, 59 and 69 and the exhaust device 70 of the film forming apparatus 100 shown in FIG. 1.

As shown in FIG. 2, the control unit 300 includes, as its major components, a plurality of module controllers (MC) 401 as individual control units provided in a corresponding relationship with the respective processing apparatuses of the substrate processing system including the film forming apparatus 100, an equipment controller (EC) 301 serving as a general control unit for controlling the entire substrate processing system and a user interface 501 connected to the equipment controller 301. The module controllers 401 may be provided not only in the film forming apparatus 100 but also in, e.g., other processing apparatuses, a load-lock chamber and a loader unit of the substrate processing system. These module controllers 401 are also controlled under the control of the equipment controller 301, but it will not be shown and described herein.

(Equipment Controller)

The equipment controller 301 is a general control unit for generally managing the respective module controllers 401 to control the overall operations of the substrate processing system. The equipment controller 301 includes a central processing unit (CPU) 303, a random access memory (RAM) 305 as a volatile memory, and a hard disk device (HDD) 307 as a storage unit. The equipment controller 301 and each module controller 401 are connected through an in-system local area network (LAN) 503. The in-system LAN 503 includes a switching hub 505. Responsive to a control signal supplied from the equipment controller 301, the switching hub 505 performs the changeover of the module controllers 401 as connection destinations of the equipment controller 301.

The equipment controller 301 is connected through a LAN 601 to a host computer 603 serving as a manufacturing execution system (MES), which manages the overall manufacturing processes in a factory in which the substrate processing system is installed. In cooperation with the control unit 300, the host computer 603 feeds back the real-time information on each process in the factory to a backbone system (not shown) and makes a judgment on the process in view of the load in the factory as a whole.

The user interface 501 is connected to the equipment controller 301. The user interface 501 includes a keyboard through which a process manager inputs a command or the like to manage the substrate processing system, a display for visually displaying the operation status of the substrate processing system, a mechanical switch, and so forth.

The equipment controller 301 is configured to store information in a computer-readable storage medium (hereinafter just referred to as "storage medium") 507 and to read out the information from the storage medium 507. A control program and a recipe stored in, e.g., the storage medium 507, can be used by installing them in the hard disk device 307 serving as a storage unit. As an example of the storage medium 507, it is possible to use, e.g., a CD-ROM, a hard disk, a flexible disk, a flash memory and a DVD. The recipe may be used online by frequently transmitting from other devices through, e.g., a dedicated line.

In the equipment controller 301, the CPU 303 reads out the program (software) including the recipe on a processing method of a wafer W from the hard disk device 307 or the storage medium 507, the processing method being designated by a user through the user interface 501. Then, the program is transmitted from the equipment controller 301 to the respective module controllers 401, whereby the respective module controllers 401 can control the processes performed in the processing apparatuses including the film forming apparatus 100. Description will now be made on the relationship between the film forming apparatus 100 and the module controller 401 for controlling the film forming apparatus 100.

(Module Controller)

The module controller 401 is provided as an individual control unit for controlling the operation of the film forming apparatus 100. As shown in FIG. 3, the module controller 401 includes a central processing unit (CPU) 403, a volatile memory unit 405 such as a RAM or the like, a nonvolatile memory unit 407 as an I/O information storage unit, and an I/O control unit 409.

The nonvolatile memory unit 407 of the module controller 401 is formed of a nonvolatile memory such as a static random access memory (SRAM), a magnetic random access memory (MRAM), an electrically erasable and programmable read-only memory (EEPROM) or a flash memory. Various kinds of history information in the film forming apparatus 100, e.g., a replacement time of the heater in the susceptor 3 and an operating time of the exhaust device 70, are stored in the nonvolatile memory unit 407. The nonvolatile memory unit 407 serves as an I/O information memory unit. As will be described later, various kinds of I/O information between the module controller 401 and the respective end devices 201 (especially, digital output information DO and analog output information AO) are frequently written on and stored in the nonvolatile memory unit 407.

(I/O Module)

The I/O control unit 409 of the module controller 401 transmits various kinds of control signals to I/O (input/output) modules 413 and receives a signal indicative of status information on the respective end devices 201 from the I/O modules 413 and the like. The respective end devices 201 are controlled by the module controller 401 through the I/O modules 413. The I/O modules 413 transfer the control signals from the module controller 401 to the respective end devices 201 and the input signals from the respective end devices 201 to the module controller 401. The module controller 401 is connected to the I/O modules 413 through a network 411. The network 411 connected to the module controller 401 includes a plurality of channels, e.g., channels CH0, CH1 and CH2.

Each of the I/O modules 413 includes a plurality of I/O boards 415 connected to the respective end devices 201 included in the film forming apparatus 100. Each of the I/O boards 415 is a lower-hierarchy control device operating under the control of the module controller 401. The input and output of digital signals, analog signals and serial signals in the I/O modules 413 are controlled by the I/O boards 415. For the sake of convenience, only the connections of the I/O boards 415 to some of the end devices 201 (the pressure gauges 48A and 58A) are representatively shown in FIGS. 1 and 2.

The input/output information managed by the I/O boards 415 includes four kinds of information, namely digital input information DI, digital output information DO, analog input information AI and analog output information AO. The digital input information DI is the digital information inputted from each of the end devices 201, which is a lower-hierarchy device in the control system, to the module controller 401, which is a higher-hierarchy device in the control system. The digital output information DO is the digital information outputted from the module controller 401, which is a higher-hierarchy device in the control system, to each of the end devices 201, which is a lower-hierarchy device in the control system. The analog input information AI is the analog information inputted from each of the end devices 201 to the module controller 401. The analog output information AO is the analog information outputted from the module controller 401 to each of the end devices 201.

The digital input information DI and the analog input information AI contain, e.g., the information on the statuses of the respective end devices 201. The digital output information DO and the analog output information AO contain, e.g., the setting values on the process conditions and the like and the commands, which are outputted to each of the end devices 201. Examples of the digital information include the information on the opening and closing of each of the chamber valves 37, 47, 57 and 67 (the solenoids 37a, 47a, 57a and 67a), the information on the on/off operation of the exhaust device 70 and the information on the opening and closing of valves (not shown) of an exhaust system. Examples of the analog information include the information on the setting temperature of a heater (not shown) in the susceptor 3 and the information on the gas flow rates of the mass flow controllers 35, 45, 55 and 65 and the information on the internal pressures of the buffer tanks 48 and 58.

I/O addresses are respectively assigned to the four kinds of input/output information DI, DO, AI and AO in a corresponding relationship with contents thereof. Each of the I/O addresses contains digital information or analog information of, e.g., 16 bits (0 to 15). The analog information is indicated by, e.g., a hexadecimal number of 0 to FFF. I/O address numbers (Addr) are allotted to the I/O addresses. As stated earlier, the network 411 connected to the module controller 401 has a plurality of channels, e.g., a channel CH0, a channel CH1 and a channel CH2. Node numbers (Node) starting from numeral 1 are allotted to the respective I/O boards 415.

Accordingly, the I/O addresses assigned to the four kinds of input/output information DI, DO, AI and AO can be specified by three kinds of parameters, namely the channel numbers, the node numbers (Node) from 1 to n (where n is an integer) and the I/O address numbers (Addr). Details of the input/output information will not be shown and described.

(Register Unit)

In the film forming apparatus 100 of the present embodiment, two kinds of register units for storing a pressure change in the buffer tank are provided in the I/O boards 415. The first kind of register unit is a maximum value register 441 for receiving, from each of the pressure gauges 48A and 58A, a pressure AI signal indicative of analog input information on the pressure in the corresponding one of the buffer tanks 48 and 58, and for storing a maximum value of peaks in the gas pressure change in each of the buffer tanks 48 and 58. The second kind of register unit is a minimum value register 443 for receiving the pressure AI signal from each of the pressure gauges 48A and 58A and for storing a minimum value of valleys in the gas pressure change in the corresponding one of buffer tanks 48 and 58. These two kinds of register units are provided by installing a firmware, e.g., a field programmable gate array (FPGA) on each of the I/O boards 415. Details of the maximum and the minimum value register 441 and 443 will be described later.

In the control unit 300 configured as above, the I/O boards 415 connected to the end devices 201 are modularized into an I/O module 413. The I/O module 413 is connected to the equipment controller 301 through the module controller 401 and the switching hub 505. In this manner, the end devices 201 are not directly connected to the equipment controller 301 but are connected to the equipment controller 301 through the I/O module 413 and the module controller 401, thereby realizing a control system hierarchy.

Further, in the present embodiment, while maintaining the basic configuration of the control system in which the equipment controller 301, the module controller 401, the I/O module 413 and the end devices 201 are arranged in the order of hierarchy from high to low, it is configured such that the maximum value register 441 and the minimum value register 443 are provided in each of the I/O boards 415, which is a lower-hierarchy device compared to the module controller 401. The maximum value register 441 and the minimum value register 443 are configured to receive the pressure AI signal on the pressure in each of the buffer tanks 48 and 58 measured by the pressure gauges 48A and 58A and to store the maximum value of the peaks and the minimum value of the valleys in the gas pressure change in the corresponding one of buffer tanks 48 and 58. In other words, the maximum value of the peaks and the minimum value of the valleys in the pressure change in each of the buffer tanks 48 and 58 are stored by using the lower-hierarchy control device compared to the module controller 401. The module controller 401 is configured to read out the results at any time.

Accordingly, while the ALD process is performed in the film forming apparatus 100, it is possible to check the process status by using the pressure change in each of the buffer tanks 48 and 58 as an indicator. By providing such multi-stage control system, there is an advantage in that, as compared with a method of directly transmitting a signal indicative of the pressure in each of the buffer tanks 48 and 58 to the module controller 401 at all time, it becomes possible to reduce the communications data amount between the I/O boards 415 and the module controller 401. Further, since the maximum and the minimum value of the pressure in each of the buffer tanks 48 and 58 can be obtained by referring to the values in the maximum and the minimum value register 441 and 443 in the corresponding one of the I/O boards 415 which is a lower-hierarchy control device in the control system, it becomes possible to reduce a load of the CPU 403 in the module controller 401. In addition, since the maximum and the minimum value of the pressure change in each of the buffer tanks 48 and 58 are surely referred to as the significant indicators in the pressure change in each of the buffer tanks 48 and 58, it becomes possible to accurately check the process status.

<ALD Process>

In the film forming apparatus 100, a wafer W is mounted on the susceptor 3. Then, a process gas is supplied through the gas introduction unit 11 toward the wafer W while the wafer W being heated by a heater (not shown). Thus, a specified thin film can be formed on the surface of the wafer W through an ALD method. For example, when forming a TiN film through an ALD method, it is possible to deposit a thin film by repeatedly performing a plurality of cycles each including steps 1) through 7) noted below.

An ALD process of one cycle includes the following steps.

1) The chamber valve 57 is opened and the $TiCl_4$ gas as a source gas is supplied from the $TiCl_4$ gas supply source 50 into the processing chamber 1, thereby causing $TiCl_4$ to adhere onto the wafer W.

2) The chamber valve 57 is closed and the supply of the $TiCl_4$ gas is stopped.

3) The chamber valve 67 is opened and the $N_2$ gas is introduced from the $N_2$ gas supply source 60 into the processing chamber 1 to purge the inside of the processing chamber 1, thereby removing the $TiCl_4$ gas remaining in the processing chamber 1.

4) The chamber valve 67 is closed and the supply of the $N_2$ gas is stopped.

5) The chamber valve 47 is opened and the $NH_3$ gas as a reaction gas is supplied from the $NH_3$ gas supply source 40 into the processing chamber 1. The $NH_3$ gas reacts with $TiCl_4$ adhered onto the surface of the wafer W, thereby forming a layer of TiN film.

6) The chamber valve 47 is closed and the supply of the $NH_3$ gas is stopped.

7) The chamber valve 37 is opened and the $N_2$ gas is introduced from the $N_2$ gas supply source 30 into the processing chamber 1 to purge the inside of the processing chamber 1, thereby removing the $NH_3$ gas remaining in the processing chamber 1.

In steps 1) through 7), while the chamber valve 57 is in a closed state, the $TiCl_4$ gas is filled into the buffer tank 58 and the pressure in the buffer tank 58 is increased. Under this increased pressure, the $TiCl_4$ gas is forcefully injected through the gas introduction unit 11 into the processing chamber 1 while the chamber valve 57 is opened in step 1). Similarly, while the chamber valve 47 is in a closed state, the $NH_3$ gas is filled into the buffer tank 48 and the pressure in the buffer tank 48 is increased. Under this increased pressure, the $NH_3$ gas is forcefully injected through the gas introduction unit 11 into the processing chamber 1 while the chamber valve 47 is opened in step 5).

Accordingly, due to the opening and closing of each of the chamber valves 47 and 57, the pressure in each of the buffer tanks 48 and 58 is repeatedly changed to a great extent. For example, the pressure change in each of the buffer tanks 48 and 58 is greater than that in each of the pipes 41 and 51. Therefore, if the pressure change in each of the buffer tanks 48 and 58 is used as an indicator, it becomes easy to detect a process abnormality.

The aforementioned cycle is repeatedly performed in the ALD process. Thus, in order to satisfactorily perform the film forming process, the supplies and cutoffs of the gases need to be intermittently repeated in a short period of time and need to be accurately carried out. In the ALD process, therefore, it becomes imperative to rapidly detect an occurrence of the pressure abnormality in each of the buffer tanks 48 and 58 in which the pressure is greatly changed in a short period of time. In the present embodiment, the maximum value register 441 and the minimum value register 443 are provided in each of the I/O boards 415. This makes it possible to reliably detect the pressure change in each of the buffer tanks 48 and 58 and to detect the process abnormality at an early time.

Figure 4:
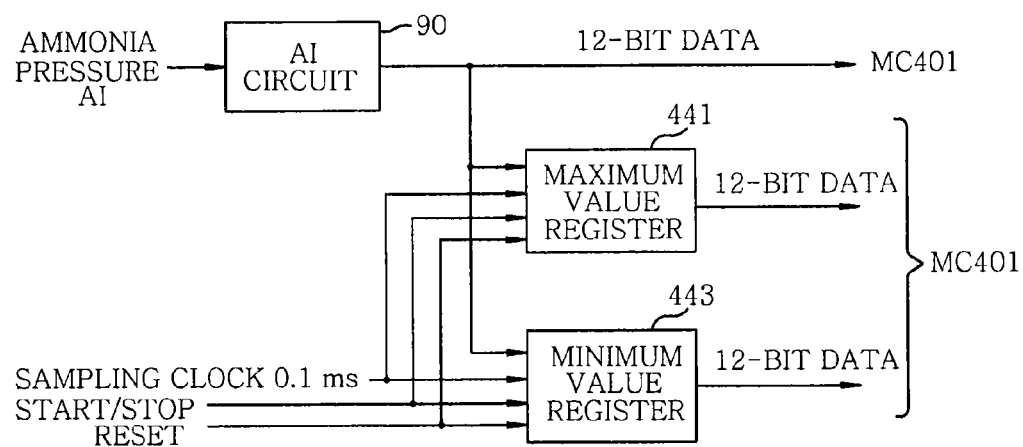
FIG. 4 is an explanatory view partially showing a control system including a register unit in accordance with the first embodiment of the present invention.
Figure 5:
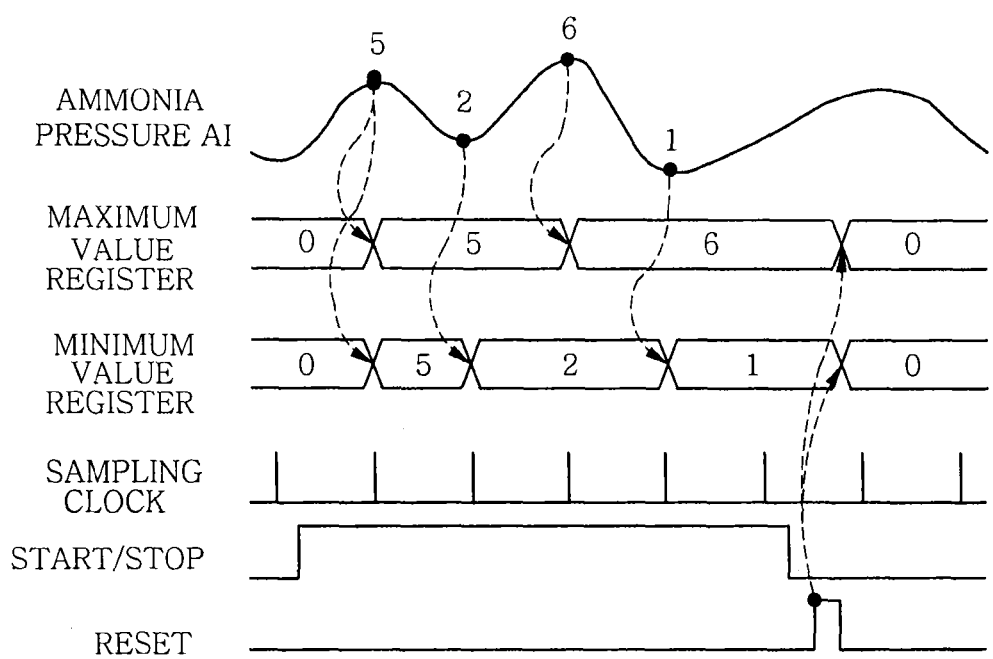
FIG. 5 is a timing chart explaining the measurement principle by using a maximum value register and a minimum value register in accordance with the first embodiment of the present invention.

FIG. 4 partially shows a control system for detecting the pressure in the buffer tank 48. FIG. 5 is a timing chart explaining the principle of storing the maximum value and/or the minimum value of the gas pressure change in the maximum value register 441 and the minimum value register 443. The $NH_3$ gas will be representatively described herein.

While the ALD process is performed in the film forming apparatus 100, an ammonia pressure AI signal as analog input information is transmitted from the pressure gauge 48A to the module controller 401 through an AI circuit 90 for performing A/D conversion. The ammonia pressure AI signal is also transmitted to the maximum value register 441 on the I/O board 415, and the maximum value register 441 stores the maximum value of peaks in the pressure change in the buffer tank 48. Further, the ammonia pressure AI signal is also transmitted to the minimum value register 443 on the I/O board 415, and the minimum value register 443 stores the minimum value of valleys in the pressure change in the buffer tank 48.

In the timing chart shown in FIG. 5, the corresponding relationship between the peaks and valleys in the pressure change of the $NH_3$ gas in the buffer tank 48 and the maximum and minimum value registers 441 and 443 is indicated by dashed-line arrows.

The maximum and the minimum value register 441 and 443 are 12-bit registers. As shown in FIG. 5, the maximum and the minimum value register 441 and 443 start or stop a storing operation in response to a start or stop command transmitted from the module controller 401. Responsive to a reset command transmitted from the module controller 401, the maximum and the minimum value register 441 and 443 are reset to zero.

In the film forming apparatus 100, the storing operation of the maximum and the minimum value register 441 and 443 may be started and stopped in conformity with, e.g., the start and end of one cycle of the ALD process or may be started and stopped in conformity with the start and end of the processing of a single wafer W. Alternatively, the storing operation may be continuously performed while a predetermined number of wafers W are processed. The sampling clock of the maximum and the minimum value register 441 and 443 may be set to be, e.g., 0.1 ms. The data of the maximum value of the peaks and the minimum value of the valleys are respectively transmitted from the maximum value register 441 and the minimum value register 443 to the module controller 401 as 12-bit data.

(Determination Method)

The checking of the process status and the abnormality determination on the process status by using the maximum and the minimum value register 441 and 443 can be conducted by measuring in advance the data of the maximum or the minimum value of the pressure change in the buffer tank 48 during the normal operation in one cycle of the ALD process and then comparing the maximum or the minimum value of the pressure change in the buffer tank 48 during the actual operation in one cycle of the ALD process with the maximum or the minimum value measured during the normal operation.

If the maximum or the minimum value of the pressure change during the actual operation significantly differs from the maximum or the minimum value of the pressure change during the normal operation, it can be determined that there may be an abnormality in the process. Further, a threshold may be set in advance with reference to the maximum or the minimum value of the pressure change during the normal operation. Then, the maximum or the minimum value of the pressure change during the actual operation may be compared with the threshold. This determination can be performed by the software (recipe) of the module controller 401.

In JP2003-286575A mentioned earlier, a curve is generated by using the detection result of characteristic parameters such as the pressure and the like, and a change in the curve shape is monitored. On the other hand, in the present embodiment, the peak and valley values in the pressure change in the buffer tank 48 are used as an indicator for indirectly checking the process status. This is because the pressure in the buffer tank 48, especially the peak and valley values therein, is changed to the greatest extent if a process abnormality occurs due to, e.g., an abnormality associated with a gas supply mechanism.

Accordingly, it is possible to detect the symptom of a process abnormality with high detection sensitivity by detecting the increase and decrease in the peak and valley values in the pressure change. In this regard, the term "an abnormality associated with a gas supply mechanism" specifically means a trouble occurring in any of the $NH_3$ gas supply source 40, the mass flow controller 45, the chamber valve 47, the solenoid 47a, and the wiring line or pipe 41 and 13 thereof or the like.

If a process abnormality is detected, for example, a notification of such abnormality may be displayed on the display of the user interface 501 or the module controller 401 may transmit a control signal to stop the ALD process in the film forming apparatus 100. The module controller 401 can read out the maximum or the minimum value of the pressure change even during the ALD process. This makes it possible to detect the process abnormality on a real time basis.

While the buffer tank 48 has been described above by way of example, the checking of the process status and the detection of the abnormality occurrence in the process status can be conducted with respect to the buffer tank 58 in a similar manner by monitoring the pressure change in the buffer tank 58, measured by the pressure gauge 58A, by using the maximum and the minimum value register 441 and 443. In case of providing buffer tanks in the pipes 31 and 61, it is equally possible to check the process status and to detect the occurrence of the abnormality by using the maximum and the minimum value register 441 and 443.

In the film forming apparatus 100 of the present embodiment described above, the maximum and the minimum value register 441 and 443, which are involved in monitoring the pressure change in each of the buffer tanks 48 and 58, are provided in each of the I/O boards 415, which serves as a control unit configured to control the input and output signals between the module controller 401 and the end devices 201 and also serves as a lower-hierarchy control unit compared to the module controller 401. In addition, it is possible to check the process status and to reliably detect the process abnormality by using the maximum value and/or the minimum value of the pressure change in each of the buffer tanks 48 and 58 acquired by the corresponding one of the maximum value register 441 and the minimum value register 443.

Further, by using the maximum and the minimum value register 441 and 443 for respectively acquiring the maximum and the minimum value of the pressure that changes significantly in the corresponding one of the buffer tanks 48 and 58 among various physical parameters associated with the process gas, it becomes possible to detect the process abnormality with a simple indicator and to reduce the communications data amount between the I/O boards 415 and the module controller 401. Accordingly, it is possible to perform rapid determination.

Further, by using the maximum and the minimum value register 441 and 443 in the present embodiment, it becomes possible to observe the symptom of an abnormality (e.g., degradation of components). It is therefore possible to prevent in advance an occurrence of abnormality in a process.

Second Embodiment

Figure 6:
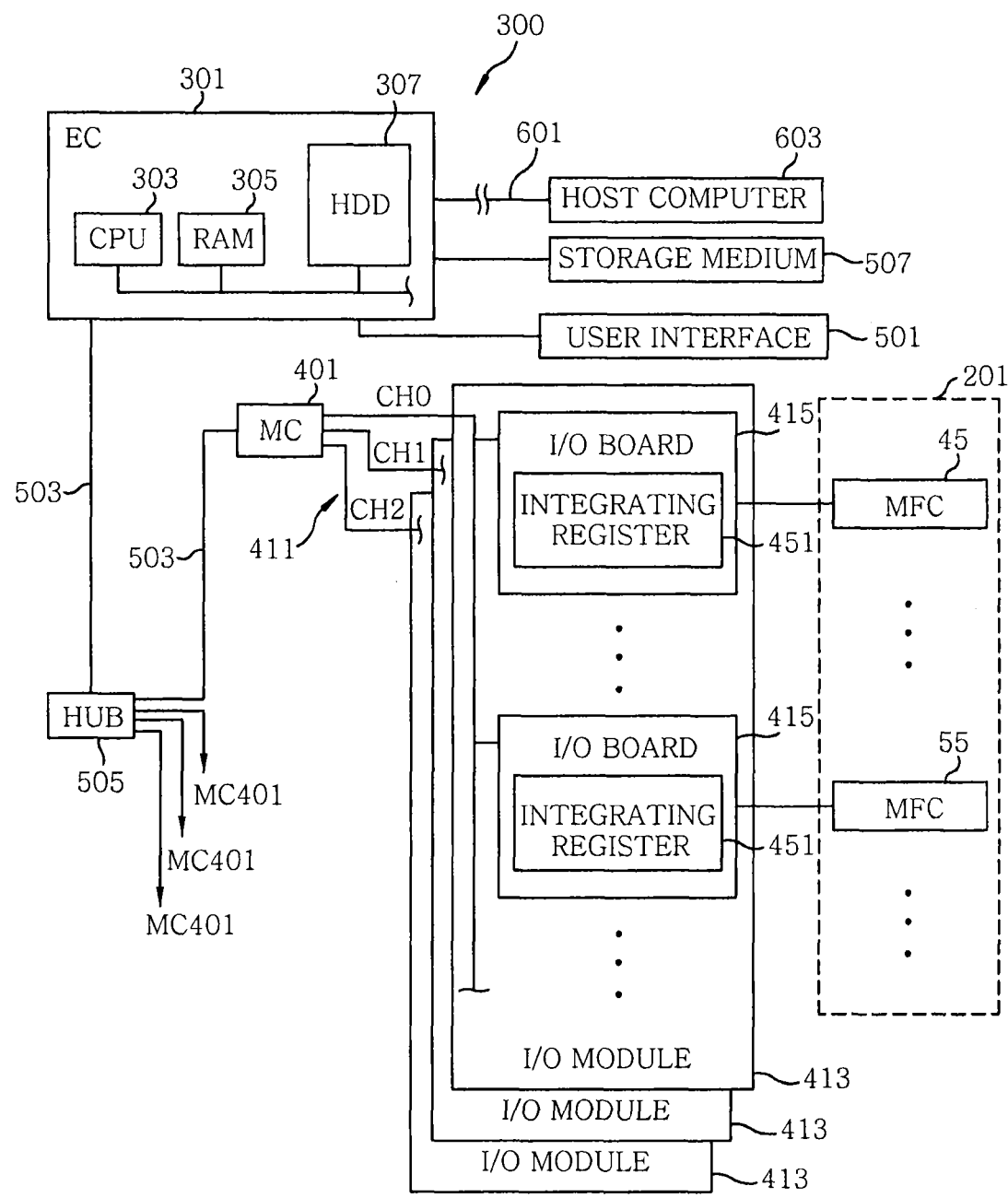
FIG. 6 is an explanatory view showing a schematic configuration of a control system for a substrate processing system including a film forming apparatus in accordance with a second embodiment of the present invention.

Next, a film forming apparatus in accordance with a second embodiment of the present invention will be described with reference to FIGS. 6 to 9. In the present embodiment, as shown in FIG. 6, a register unit for integrating a flow rate of a gas passing through each of the mass flow controllers 45 and 55 is provided in the I/O board 415, which is a lower-hierarchy control device compared to the module controller 401. More specifically, the register unit includes an integrating register 451 for integrating a flow rate of a gas passing through each of the mass flow controllers 45 and 55 based on an AI signal transmitted from the corresponding one of flow meters (measuring unit) 45a and 55a in the mass flow controllers 45 and 55. In the film forming apparatus of the present embodiment, the components other than the integrating register unit are the same as the components of the film forming apparatus 100 of the first embodiment. Therefore, the following description will be focused on the differing points.

Figure 7:
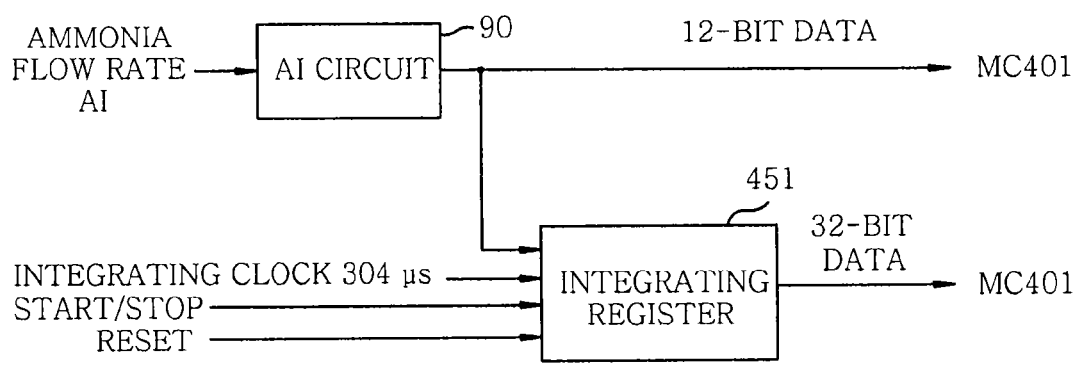
FIG. 7 is an explanatory view partially showing a control system including a register unit in accordance with the second embodiment of the present invention.
Figure 8:
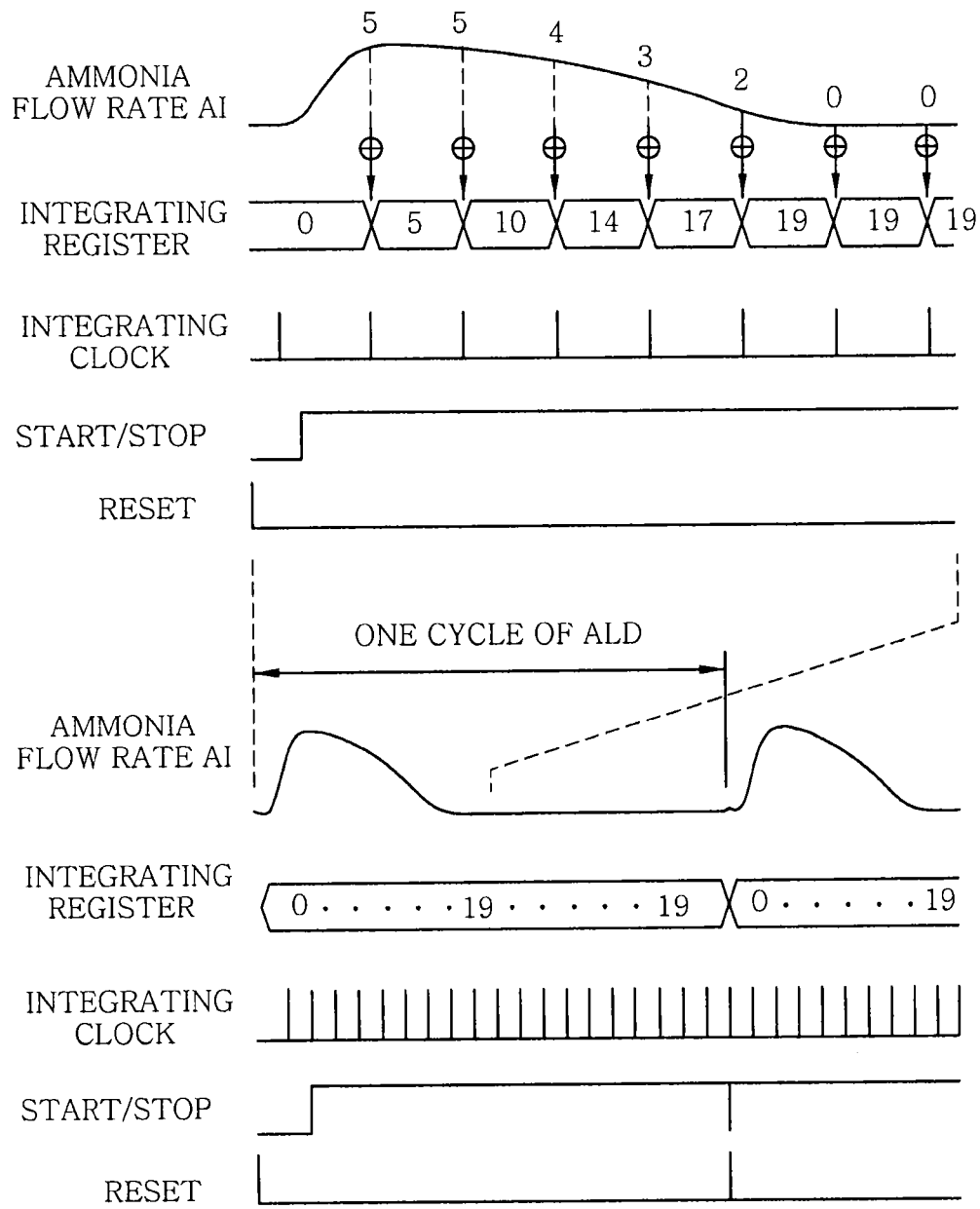
FIG. 8 is a timing chart explaining the measurement principle using an integrating register in accordance with the second embodiment of the present invention.

FIG. 7 partially shows a gas flow rate control system of each of the mass flow controllers 45 and 55 including the integrating register 451. FIG. 8 is a timing chart explaining the principle of integrating a gas flow rate by using the integrating register 451. As a representative example, the mass flow controller 45 will be described herein.

While the ALD process is performed in the film forming apparatus 100, a gas flow rate of an NH$_3$ gas measured by the flow meter 45a of the mass flow controller 45 is transmitted, as an ammonia flow rate AI signal, i.e., analog input information AI, from the mass flow controller 45 to the module controller 401 through an AI circuit 90 for performing A/D conversion. The ammonia flow rate AI signal is also transmitted to the integrating register 451 on the I/O board 415.

The integrating register 451 is a 32-bit register. As shown in FIG. 8, the integrating register 451 starts or stops an integrating operation in response to a start or stop command transmitted thereto from the module controller 401. Responsive to a reset command, the integrating register 451 is reset to zero.

If a unit time period for the integration is, e.g., one cycle of the ALD process, the integrating operation can be started and stopped in conformity with the start and end of the cycle. Further, if each of the steps in a single cycle has a short time period as in the ALD process, it may be difficult to determine normality or abnormality by using an ammonia flow rate integrating value over a single step. In this case, an ammonia flow rate may be integrated over a plurality of steps (i.e., the same steps in a plurality of cycles). By integrating the ammonia flow rate over the plurality of steps, it is possible to accurately check the process status and to accurately perform the abnormality determination as compared with a case where the ammonia flow rate is integrated on a single step basis. The number of the plurality steps may be set to the number required for processing a single wafer W.

After the ammonia flow rate AI signal is received, the integrating register 451 integrates an ammonia flow rate over, e.g., one cycle of the ALD process. In the timing chart shown in FIG. 8, a lower half part shows the principle of integrating an ammonia flow rate over one cycle of the ALD process. An upper half part shows a portion of the lower half part on an enlarged scale. As can be seen from the waveform of the ammonia flow rate AI signal shown in FIG. 8, the ammonia flow rate reaches a large peak value at the initial stage of the gas supply step in the ALD process and then is gradually decreased to zero. If the next cycle is started, the ammonia flow rate reaches a large peak value again at the initial stage. In this manner, the period of the gas flow rate with the large peak forms a pulse pattern. The integrating register 451 integrates 12-bit ammonia flow rate AI signal at an interval of, e.g., 304 μs.

Figure 9:
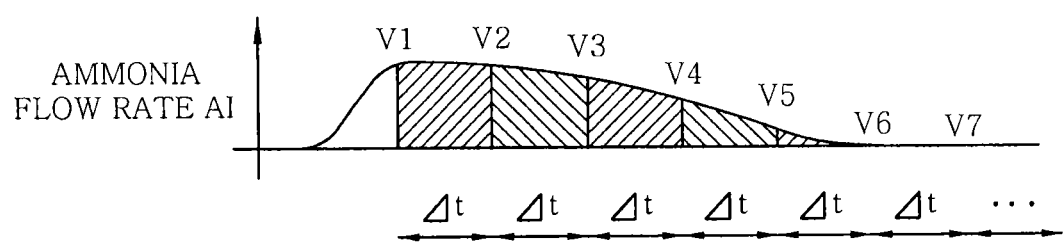
FIG. 9 is an explanatory view explaining the integrating principle using the integrating register in accordance with the second embodiment of the present invention.

As shown in FIG. 9, the integrating register 451 integrates the ammonia flow rate by dividing an ammonia flow rate curve of the ammonia flow rate AI signal over time Δt and adding up the trapezoidal areas between the respective Δt. For example, the gas flow rate integrating value can be calculated by the following equation:

Gas Flow Rate Integrating Value $$= \frac{1}{2}(V_1 + V_2) \times \Delta t + \frac{1}{2}(V_2 + V_3) \times \Delta t + \ldots \frac{1}{2}(V_{n-1} + V_n) \times \Delta t$$

$$= \left(\frac{1}{2}V_1 + V_2 + V_3 \ldots + V_{n-1} + \frac{1}{2}V_n\right) \times \Delta t.$$

The integrating value obtained by the integrating register 451 is transmitted to the module controller 401 as 32-bit data.

(Determination Method)

The checking of the process status and the abnormality determination on the process status by using the integrating register 451 can be performed by, e.g., comparing an integrating value of an ammonia flow rate during the actual operation in one cycle of the ALD process obtained by the integrating register 451 with a preset flow rate in one cycle of the ALD process included in an analog output signal having a control command on an ammonia flow rate generated by the module controller 401. Alternatively, for example, an integrating value of an ammonia flow rate in one cycle of the ALD process during the normal operation may be measured in advance. Then, an integrating value of an ammonia flow rate in one cycle of the ALD process during the actual operation may be compared with the integrating value of the ammonia flow rate during the normal operation. If the integrating value of the ammonia flow rate during the actual operation differs significantly from the preset flow rate or the integrating value of the ammonia flow rate during the normal operation, it can be determined that there may a process abnormality. In this case, the integrating value measured during the actual operation may be compared with a predetermined threshold.

In the present embodiment, the integrating value of the flow rate of the ammonia gas passing through the mass flow controller 45 during one cycle of the ALD process is used as an indicator for indirectly checking the process status. This is because the flow rate of the ammonia gas passing through the mass flow controller 45 is changed if an abnormality occurs in the gas supply mechanism or if there occurs an abnormality such as the excess or shortage of a gas supply pressure in the NH$_3$ gas supply source 40 or the clogging of the pipe 41 caused by the reaction product of a source gas. Therefore, by observing the increase and decrease in the flow rate of the ammonia gas during every one cycle of the ALD process, the symptom of a trouble can be accurately detected.

In JP2003-286575A mentioned earlier, a curve is generated by using the detection result of characteristic parameters such as the gas flow rate and the like, and a change in the curve shape is monitored. On the other hand, in the present embodiment, the process status is checked depending on the flow rate integrating value calculated based on the area formed by the change in the curve and not based on the change in the curve shape itself. It is therefore possible to detect the process abnormality with high detection sensitivity and to determine the process abnormality with ease.

The aforementioned determination can be performed by the software (recipe) of the module controller 401. If a process abnormality is detected, the module controller 401 may transmit a control signal to, e.g., stop the ALD process in the film forming apparatus 100. The integrating register 451 can read out the integrating value of the ammonia flow rate even during the ALD process. This makes it possible to check a process status and to detect a process abnormality on a real time basis. In addition, if the data of the 12-bit ammonia flow rate AI signal is added up by the 32-bit integrating register 451 at an interval of, e.g., 304 μs, it is possible to perform the integrating operation for up to five minutes (=304 μs×2$^{(32-12)}$), which allows the integrating operation for one cycle of the ALD process to be performed sufficiently.

While the flow rate of the ammonia gas passing through the mass flow controller 45 has been described above by way of example, the similar determination can be conducted with respect to the flow rate of the TiCl$_4$ gas passing through the mass flow controller 55 by using the integrating register 451 associated with the flow rate of the TiCl$_4$ gas. Further, with respect to the N$_2$ gas, the similar determination can be conducted by using the corresponding integrating register 451.

In the film forming apparatus of the present embodiment, the integrating register 451 for measuring the integrating value of the flow rate of the gas passing through each of the mass flow controllers 45 and 55 is provided in the I/O board 415, which is a lower-hierarchy control device compared to the module controller 401 and is configured to control the input and output signals between the module controller 401 and the end devices 201. In addition, it is possible to check the process status and to rapidly detect the process abnormality by using the integrating value acquired by the integrating register 451.

By acquiring the integrating value from the integrating register 451 provided in the I/O board 415 which is a lower-hierarchy control device in the control system, not from the module controller 401 which is a higher-hierarchy control device in the control system, it becomes possible to reduce the communications data amount between the I/O boards 415 and the module controller 401 and to reduce the load of the CPU 403 which occurs if the integrating value is calculated in the module controller 401.

In addition, by using the integrating value of the integrating register 451, it becomes possible to observe the symptom of an abnormality (e.g., the constriction or clogging of the gas supply paths such as the pipes and the like). It is therefore possible to prevent in advance an occurrence of a process abnormality.

Other configurations and effects of the film forming apparatus of the present embodiment remain the same as those of the film forming apparatus of the first embodiment.

While certain embodiments of the present invention have been described above, the present invention is not limited to the aforementioned embodiments but may be modified in many different forms. For example, the present invention is not limited to the semiconductor wafer but may be applied to, e.g., a processing apparatus for processing a large-size glass substrate for use in a liquid crystal display or an organic EL display.

While the invention has been shown and described with respect to the embodiments, it will be understood by those skilled in the art that various changes and modification may be made without departing from the scope of the invention as defined in the following claims.

What is claimed is:

1. A processing apparatus comprising:
    a processing chamber configured to accommodate a target object to be processed;
    a plurality of gas supply paths provided in a corresponding relationship with respective kinds of process gases supplied into the processing chamber;
    a plurality of valves arranged in the respective gas supply paths and configured to open and close the respective gas supply paths;
    a buffer tank arranged in at least one of the plurality of gas supply paths at an upstream side of the corresponding valve along a gas supply direction;
    a pressure gauge configured to measure a gas pressure in the buffer tank;
    a register unit configured to store only an updated value for at least one of a maximum and a minimum value of a change in the measured gas pressure in the buffer tank; and
    a control unit configured to determine a process status based on the updated value stored in the register unit.

2. The processing apparatus of claim 1, wherein the control unit determines the process status to be abnormal if said at least one of the maximum and the minimum value exceeds a predetermined threshold.

3. The processing apparatus of claim 1, wherein the processing apparatus is an atomic layer deposition apparatus for forming a film on the target object by alternately supplying different kinds of gases.

4. The processing apparatus of claim 1, further comprising a control device subordinate and connected to the control unit and configured to transmit and receive signals to and from the control unit, the control device being configured to control input and output signals between the control unit and end devices under the control of the control unit,
    wherein the register unit is provided in the control device, and
    wherein the control unit is configured to read out the updated value stored in the register unit to determine the process status based on the updated value.

* * * * *